Aug. 11, 1970 J. L. HUTSON 3,524,114

THYRISTOR HAVING SENSITIVE GATE TURN-ON CHARACTERISTICS

Filed Feb. 29, 1968 2 Sheets-Sheet 1

INVENTOR
JEARLD L. HUTSON

Clegg, Harwood & Francis
ATTORNEY

INVENTOR
JEARLD L. HUTSON

Clegg, Harwood & Francis
ATTORNEY

United States Patent Office 3,524,114
Patented Aug. 11, 1970

3,524,114

THYRISTOR HAVING SENSITIVE GATE TURN-ON CHARACTERISTICS

Jearld L. Hutson, 907 Newberry, Richardson, Tex. 75080

Filed Feb. 29, 1968, Ser. No. 709,374
Int. Cl. H01l *11/10*
U.S. Cl. 317—235 13 Claims

ABSTRACT OF THE DISCLOSURE

A thyristor comprises a semiconductor body having a plurality of successively contiguous regions of alternate electrical conductivity types with rectifying junctions formed between contiguous regions; conduction electrodes connected to a pair of non-contiguous regions; a gate electrode connected to another of the regions; and one or more inversion layers for shunting leakage currents around surface exposed junctions.

It is difficult to manufacture conventional thyristor devices (conventional SCR's) that have very sensitive gate turn-on characteristics but which have, in all other respects, excellent operating characteristics. By sensitive gate turn-on is meant a device which will switch, by means of regeneration, from its non-conductive to conductive state upon the application to the gate electrode of a current less than about 500 microamperes.

One parameter that affects the gating or turn-on characteristics of a thyristor is leakage current flowing across the surface exposed junctions of the device. Leakage current, of course, reduces the sensitivity of turn-on of the device, since the leakage current itself tends to cause the device to become regenerative and to switch. Although leakage current in most devices is insufficient by itself cause the device to switch under normal operating conditions, it is a factor unknown in magnitude that adds to the gating signal so that control of switching of the device is reduced or lost, especially at higher operating temperatures.

Some improvements have been made in thyristor devices by shorting contiguous emitter and base regions of the device to improve the gating characteristics as a function of temperature by shunting out thermally generated leakage current, and also to reduce the *dv/dt* turn-on sensitivity of the device, all as is well known. However, this also causes the device to be much less sensitive in its turn-on characteristic when a signal is applied to the base region, since the direct short between the base and emitter regions requires a signal of sufficient magnitude to effect injection of carriers, by means of lateral voltage drop along the emitter junction, from the emitter in sufficient quantity to cause regeneration to occur.

In addition to thermally generated, or bulk, leakage current effects, leakage currents across surface exposed junctions, even when protected by conventional means, have much more serious effects on turn-on sensitivity, since these currents are generally much larger in magnitude. This is especially true for the relatively large leakage currents across the reverse-biased or blocking junction in a thyristor as a result of the high electric field present at the junction, which currents cause or contribute to emitter injection that initiates regeneration.

This invention constitutes an improvement by providing a device that has a very sensitive turn-on characteristic, or that will switch from its non-conductive state with a minimum gate signal applied thereto. Sensitivity here is referred to as accurate control for switching the device with a minimum gate signal by virtually eliminating the effects of leakage current of unknown magnitudes that would ordinarily add to the gating signal. The construction of the device also lends itself to economical production in mass quantities. In contrast, conventional devices are normally screened on the basis of test results only to obtain selected devices of sensitive turn-on characteristics, which greatly increases the unit cost of production.

The thyristor device of the invention, in its conventional aspects only, comprises a plurality of successively contiguous regions of alternate electrical conductivity types within a single body of semiconductor material, with rectifying junctions existing between contiguous regions. A pair of non-contiguous regions constitutes emitter regions for the device, and conduction electrodes are attached to these emitter regions, respectively. Another pair of regions, contiguous to the two emitter regions, respectively, constitute base regions. A gate electrode is employed to switch the device by applying a gating signal thereto.

In accordance with the invention, one or more inversion layers are formed in or adjacent surface exposed regions of the device to shunt leakage currents around surface exposed junctions, so as to minimize or eliminate any contribution to regeneration, or switching caused by these leakage currents. In a particular aspect of the invention, an auxiliary regenerative device is integrated into the main device, which preferably has a shorted emitter base construction, and includes distinct emitter and base regions but shares other regions in common with the main switch. The emitter of the auxiliary device is electrically connected to one of the emitters of the main device, and a gate electrode is connected to the auxiliary base for switching the auxiliary device, thereby causing the main device to switch. Inversion layers are formed or created adjacent surface exposed regions to provide a shunting path around surface exposed junctions to the main device emitter electrode to minimize or eliminate the effects leakage currents would have in causing the auxiliary device to switch without the shunting effect. The resistance path provided by the inversion effect changes with temperature to shunt out larger leakage currents as the temperature rises.

In another specific aspect, the main device is switched through a gate electrode attached to a base region of the main device, at least one auxiliary region is integrated with the main device electrically connected to an emitter electrode, and an inversion layer shunts out the leakage currents to this electrode through the auxiliary region for the same purpose.

In a further aspect, a symmetrical switch device is provided with shorted emitter base constructions, with an auxiliary device integrated with the main device that is characterized by a Zener effect for gating the auxiliary device. Sensitivity for gating through the Zener construction is provided by employing the inversion layer effects mentioned above.

Other objects, features and advantages will become readily apparent from the following detailed description when taken in conjunction with the appended claims and the attached drawing in which:

Figures 1, 3, 4, 5, 7, 8:
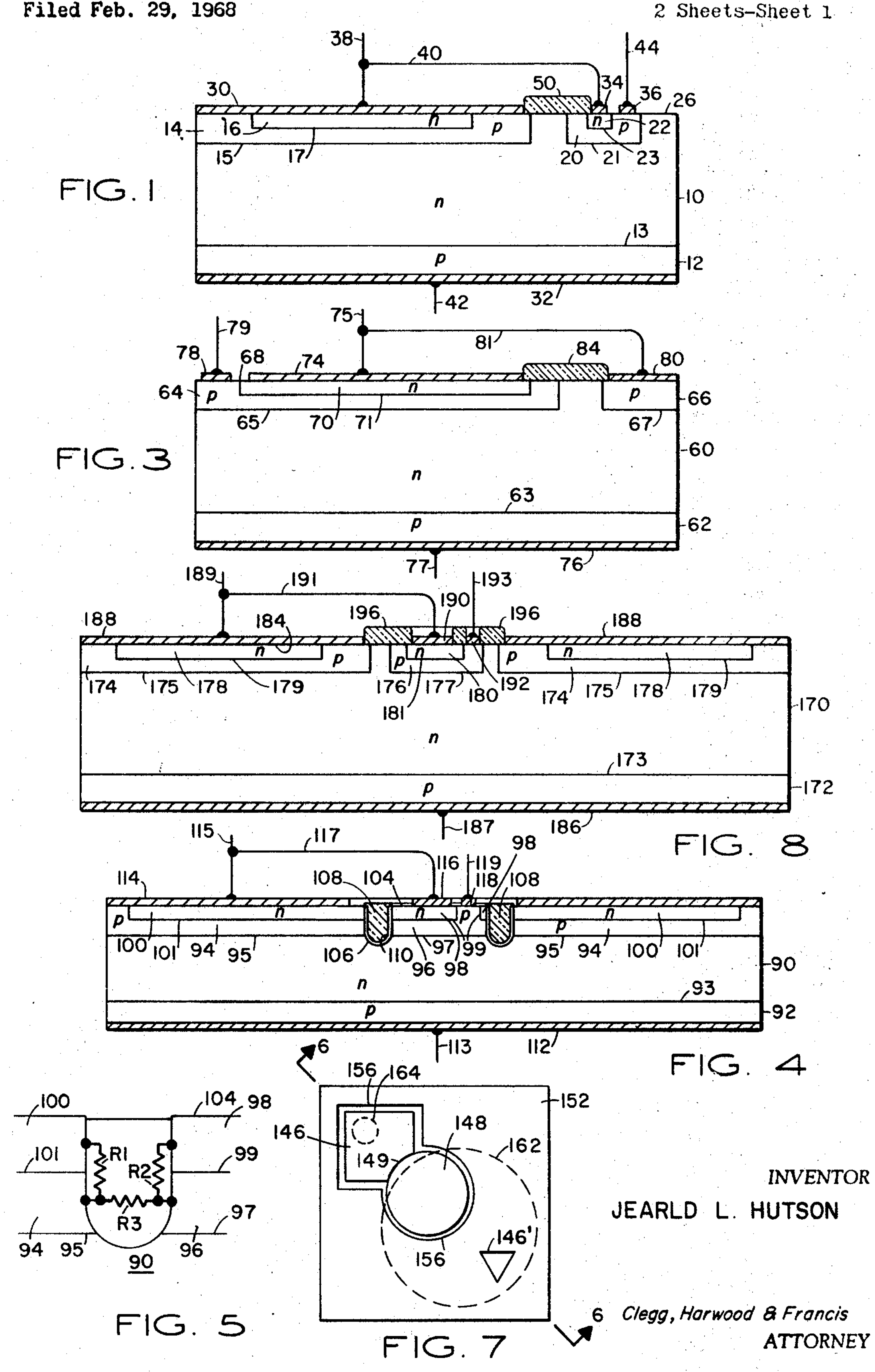
FIG. 1 is a side elevational view, in section, of a planar constructed asymmetrical regenerative switch device according to the invention.
FIG. 3 is a side elevational view, in section, of another planar constructed asymmetrical regenerative switch device according to the invention.
FIG. 4 is a side elevational view, in section, of another embodiment employing a mesa type construction.
FIG. 5 is a fragmentary view of a portion of the device shown in FIG. 4 illustrating, schematically, the resistances paths provided by inversion layers formed adjacent surface exposed regions.
FIGS. 6 and 7 are a side elevational view, in section, and a top plan view, respectively, of still another embodiment that employs both planar and mesa type constructions.
FIGS. 8 and 9 are side elevational views, in section, of still further embodiments in which the main devices are characterized by asymmetrical conduction.

Referring to FIG. 1, an elevational view, in section, of a first embodiment of an asymmetrical semiconductor regenerative device is shown in wafer form. Although any suitable semiconductor material can be used, and the electrical conductivity types to be specified hereinafter can be interchanged, reference will be had to silicon as the material and to particular electrical conductivity types.

Initially, an n-type electrical conductivity silicon wafer 10 is diffused on both sides to form a p-type region 12 in the bottom of the wafer forming a rectifying junction 13 with the original wafer 10, and another p-type electrical conductivity region 14 in the top forming a rectifying junction 15 with the wafer. In this embodiment, region 12 has an area coextensive with the area of the wafer at the bottom, whereas region 14 has an area less than the total area of the wafer at the top. The particular diffusions are carried out in conventional manner to form a planar type construction, wherein the junction of p-type region 14 extends to the top surface 26 of the wafer. The particular size and shape of region 14 is determined by suitable masking and photographic techniques conventionally employed in semiconductor diffusion technology. At the same time that region 14 is formed, another p-type conductivity region 20 is formed in the top of the wafer spaced from region 14 and which forms a rectifying junction 21 with the original wafer.

After these regions are formed, an n-type electrical conductivity region 16 is diffused in region 14 forming a rectifying junction 17 therewith, and an n-type region 22 is diffused in p-type region 20 to form a rectifying junction 23 therewith. Junctions 17 and 23 also intersect the top surface of the wafer in a planar type construction.

All of the various regions mentioned hence far can be formed in any suitable manner known in the art, wherein conventional diffusion techniques, using suitable dopants or impurities, are employed that are compatible with the particular semiconductor material from which the device is fabricated, as is also well known in the art.

An electrode 30 comprising any suitable metal or alloy, such as nickel for example, is bonded to the top surface of the wafer to regions 16 and 14 extending across junction 17 at the surface of the wafer to short regions 14 and 16. Region 16 constitutes the main emitter for the regenerative switch device, and region 14 constitutes a base region therefor that is shorted to emitter region 16. The reason for shorting the emitter and base regions is to improve the operating characteristics of the device as a function of temperature by shunting out thermally generated leakage current that tends to cross junction 17 and cause regeneration to occur at these higher temperatures. (See General Electric Company SCR Manual, 4th Edition, 1967, p. 10.) The effect of the shorted emitter-base regions is well known and will not be further elaborated on here, except to say that shorting of base region 14 through which the gate signal is normally applied for controlling the switching of the device gives the device a less sensitive turn-on characteristic to achieve the improved higher temperature operating result.

Another electrode 32 is attached to region 12, the latter of which constitutes the other emitter region of the device. Region 10, comprising the main portion of the original semiconductor wafer, constitutes what will sometimes be referred to hereinafter as the middle or wide base region of the device.

An electrode 34 is attached to n-type conductivity region 22, the latter of which constitutes an emitter region for another auxiliary regenerative device integrated within the main wafer and having regions 10 and 12 in common with the main device. Still another electrode 36 is attached to region 20, the latter of which constitutes a base region for the auxiliary device and to which a gating signal is applied for controlling switching of the device. Thus two regenerative devices are formed within the wafer in this particular embodiment, with the main regenerative device comprising regions 16, 14, 10 and 12, and an auxiliary regenerative device comprising regions 22, 20, 10 and 12. The main regenerative device comprises, in this embodiment, a shorted emitter-base construction at one emitter thereof, whereas the auxiliary device does not have a shorted emitter construction.

Electrical connections 38, 40, 42 and 44 are attached, in any conventional manner, to electrodes 30, 34, 32 and 36, respectively, with the emitter electrode 34 of the auxiliary device being connected to the emitter electrode 30 of the main device by connection 40 to establish these emitter regions at the same potential during operation when a voltage is applied between connections 38 and 42.

Glass 50 is applied to the top surface 26 of the wafer between electrodes 30 and 34 so as to cover and extend across at least portions of surface exposed junctions 15, 21 and 23. This glass, when applied, causes inversion layers to be formed adjacent the surfaces of exposed n-type regions 10 and 22, wherein an inversion layer has a minority carrier density at or adjacent the surface of the region equal or greater than the majority carrier bulk density. This provides shunting paths in the top surface of auxiliary n-type emitter region 22 around the surface exposed portion of junction 23 and in the exposed surface of wide base region 10 around the surface exposed portions of junctions 21 and 15. That is to say, leakage current, instead of crossing junctions 21 and 23 to cause emitter 22 to inject carriers at undesirable times in an uncontrolled manner, are shunted around these junctions to electrode 30. The effect of this on sensitivity of switching will become more apparent below.

The inversion layers can be formed by any suitable means and/or method. In one specific example, the glass 50 was employed and comprised approximately 50% lead oxide (PbO), 40% silicon dioxide ($SiO_2$), 10% aluminum oxide ($Al_2O_3$), and traces of boron, zirconium, zirconium oxide, titanium, barium, calcium and other refractories and transition metal oxides. The trace of boron is normally present in glass of this nature, and the traces of refractory and transition metal oxides are derived from making the glass in a refractory crucible, such as a zirconium crucible. The glass is heated for about two minutes at about 850° C. in air, or other atmosphere, wherein the temperature and time are not critical except to be sufficient to fuse the glass.

It is thought that the trace of boron is primarily effective to cause the inversion layer to form. The inversion layer itself is formed right at the surface of the wafer and can either be formed in the surface of the wafer in the glass adjacent the surface, or in both. For the time and temperature specified above, it is believed that the inversion layer, or the equivalent thereof, is a combination of the glass with its impurities and the silicon material. It will be understood, however, that an inversion layer can be formed in any other suitable manner such as by diffusing suitable impurities into the exposed surface of the wafer, for example.

The device shown in FIG. 1 is a unidirectional or asymmetrical conducting switch and can be rendered conductive for only one polarity of voltage applied between connections or leads 38 and 42. When the voltage applied to conduction electrode 38 is positive with respect to that applied to conduction electrode 42, the device blocks and cannot be rendered conductive. When the voltage applied to conduction electrodes 42 is positive with respect to the voltage applied to electrode 38, the device can be rendered conductive to switch to a low impedance state between these two conduction electrodes upon the application thereto of the proper gating signal.

To switch the device, a gating signal is applied to connection 44 by applying a positive voltage thereto with respect to emitter region 22 so that this emitter region injects carriers into base region 20 that are collected at the blocking junction 21. Further injection by the various junctions of the auxiliary switch causes it to become regenerative and to switch to a low impedance or conducting state between electrodes 32 and 34, all as is well known. Once this device switches on, the wide base region 10 becomes flooded with carriers so as to cause the main regenerative switch device comprising regions 16, 14, 10 and 12 to switch to its low impedance state by similar phenomena. Although a larger signal is normally required to switch on a regenerative device when the gating signal is applied to the wide or middle base region 10, a larger signal is available in the form of flooding this region with carriers, caused by regenerative action of the auxiliary device.

Sensitivity in switching the auxiliary device with a very small gating signal will become apparent, as follows: With a negative voltage applied to electrode 30 with respect to electrode 32, any leakage currents tending to cross junctions 23 and 21 are shunted around these junctions through the inversion layers to electrode 30. In other words, the effective resistance of the inversion layer is less than that through the junctions. Thus these leakage currents do not contribute to causing regeneration within the auxiliary device. When a gating signal is applied to base 20, only this signal is effective in switching the device.

The above described device has been operated to switch with a gate signal in the order of about 200 microamperes, whereas conventional sensitive gate thyristors are difficult to obtain that can be switched with a gate signal of between 500 microamperes and one milliampere. It is known that leakage current of greatest magnitude tends to flow through the reverse-biased or blocking junction 21 at the surface exposed portion thereof due to the high electric field present at this junction. If this occurs, this magnitude of carriers cannot be compensated for in the p-type base region 20, resulting in many of these carriers crossing the emitter junction 23 and causing the emitter to inject carriers that initiate regeneration. An inversion layer is readily formed in the vicinity of the blocking junction 21 in the surface of n-type base region 10, since the latter is relatively lightly doped and, accordingly, is relatively easily converted. On the other hand, the n-type emitter region 22 is heavily doped and is not easily converted. Thus it is believed that the surface exposed portion of region 22 immediately adjacent junction 23 is converted at least to some extent, whereas the conversion to a true inversion region is less complete at the surface exposed portion as a function of distance away from junction 23. Nevertheless, it has been found that leakage current is shunted around junction 23 to electrode 34 to prevent regeneration, wherein the glass between junction 23 and electrode 34 at least constitutes a resistance path for this conduction. As a result, most of the leakage current is shunted around emitter junction 23 from p-type base region 20 through the resistance path to electrode 34, the latter of which is connected to electrode 30, or lead 38.

Figures 2, 10:
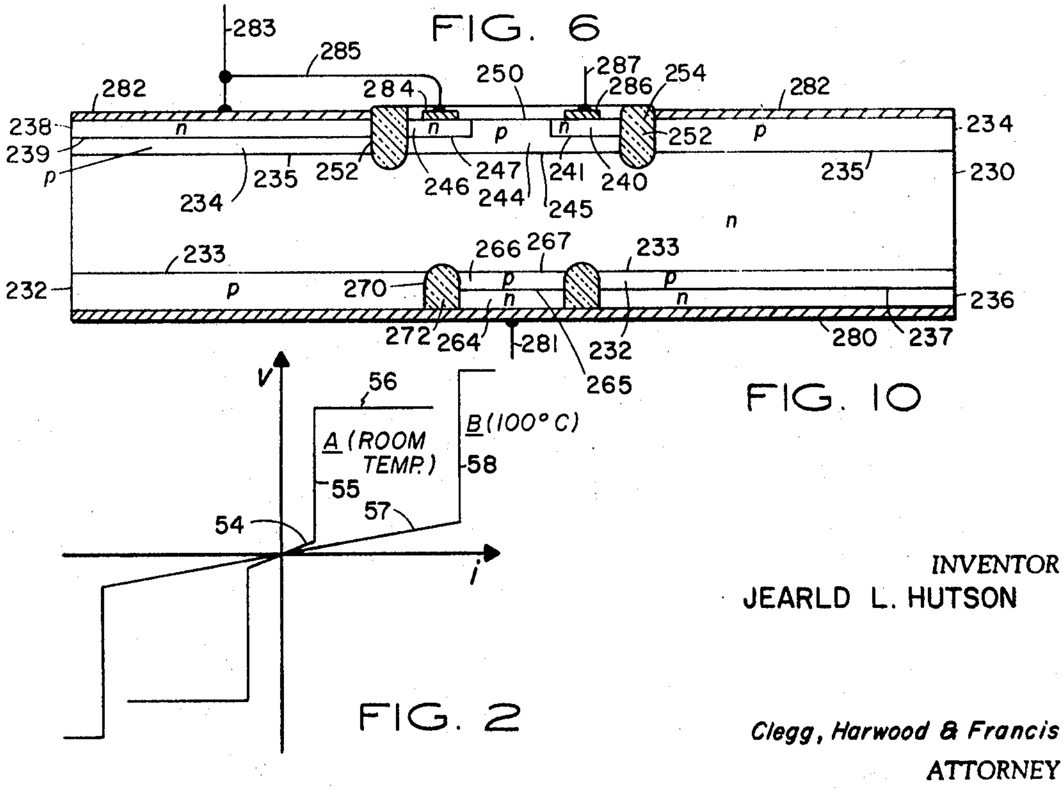
FIG. 2 is a graphical representation of the *v–i* characteristics of an inversion layer for different temperatures.
FIG. 10 is a side elevational view, in section, of a device characterized by symmetrical or bilateral conduction.

Referring to the graphical representation of FIG. 2, the approximate *v–i* characteristics of the inversion layers are shown. At room temperature, designated curve A, the resistance of the inversion layer path is relatively high in the megohms along curve portion 54 up to less than one volt, increases in region 55 up to several hundred volts and then breaks over to a lower resistance thereafter in region 56. Regardless of the practical voltage applied across the inversion layer which is below region 56, the resistance is high, but the leakage current is relatively low at this temperature, around a few microamperes. This, therefore, provides a resistance through the layer less than across the junction. For increasing temperatures, the resistance of the inversion layer path decreases. For example, at about 100° C., designated curve B, the resistance of the inversion layer path is relatively low, for example about 1–50K ohms as determined by the slope of curve portion 57 for a relatively narrow range of voltages. At les than one volt, the resistance increases as shown by slope 58, and at still a much higher voltage, breaks over again to a very low resistance. The effect of the inversion layer approximates that of a field effect transistor as shown by the *v–i* curves. Thus for lower temperatures, the inversion layer resistance is higher, but leakage current is lower for the range of operating voltages applied. For higher temperatures, the leakage current increases (both bulk or thermally generated leakage currents and surface leakage current), and correspondingly, the inversion layer resistance decreases, thus providing a path for shunting. It is thought that the resistance of the inversion layer at the higher temperature curve is determined somewhere around the resistance change point between slopes 57 and 58 of curve B, and primarily of slope 57 near this point. The overall result is a shunting path having resistances changing as a function of temperature to compensate for changing values of leakage currents.

There is shown in FIG. 3 another embodiment of a thyristor of this invention, the semiconductor wafer again being shown in a sectional, side elevational view. A wafer 60 of semiconductor material, such as n-type conductivity silicon, for example, is diffused on both sides with impurities to form p-type regions in opposite faces thereof. These diffusions are made simultaneously with suitable masking techniques, all noted above. A p-type emitter region 62 is diffused in the lower face of the wafer and forms a rectifying junction 63 with the original wafer. Simultaneously, a p-type base region 64 is diffused into a major portion of the top surface 68 of the wafer to form a rectifying junction 65 therewith, the latter of which is brought to the top surface in a planar construction. At the same time, another p-type region 66 is diffused into the top surface to form a rectifying junction 67 therewith, the latter of which is also brought to the top surface in planar construction. Regions 64 and 66 are spaced and isolated from each other through the original wafer 60. After these diffusions, an n-type region 70 is diffused into region 64 to form a rectifying junction 71 therewith and constitutes the n-type emitter region for the device. Junction 71 is also brought to the top surface in planar construction.

An electrode 74 is bonded to the surface of emitter region 70, and an electrical lead 75 is attached to the electrode. Similarly, an electrode 76 is bonded to the bottom surface of the wafer in contact with p-type emitter region 62 with an electrical lead 77 being attached thereto. Another electrode 78 is attached to the surface exposed portion of p-type gate region 64 with a lead 79 attached thereto. The gating or control signal is applied to the p-type base region 64 through the electrode 78 and lead 79 for controlling the operation of the device. Another electrode 80 is bonded to the top surface of p-type region 66 with a lead 81 attached thereto and connected to lead 75. Thus p-type region 66 and n-type emitter region 70 are connected together so as to be maintained at the same potential during operation.

Glass 84, as described with reference to FIG. 1, is applied to the top surface of the wafer between electrodes 74 and 80. Thus the glass 84 contacts at least a portion of all of junctions 71, 65 and 67 at the top surface 68 of the wafer and physically spans across portions of each of regions 70, 64, 60 and 66. Inversion layers are formed between the glass and wafer in the contacted portions of n-type region 60 and n-type region 70. Thus a shunting path is provided between n-type emitter region 70 and p-type base region 64 to p-type region 66 through the surface of wide n-type base region 60, so that leakage currents are shunted out to electrode 74, or lead 75, without crossing the junction to cause regeneration.

This device does not have an auxiliary regenerative device such as that shown in FIG. 1 but includes the p-type region 66 that is electrically connected in common with conduction electrode 74 through lead 81, and emitter region 70 is shunted to this region. Since the device is required to have a sensitive turn-on characteristic through a gate signal applied to electrode 78, the n-type emitter region 70 is not shorted by electrode 74 to the p-type gate region 64. In other words, a shorted base-emitter construction is not as compatible with a sensitive gate turn-on requirement in this type of construction, whereas the device of FIG. 1 includes an auxiliary regenerative switch, in addition to the main power switch, that does not have the shorted base-emitter construction.

Another device having a mesa type construction as compared to a planar construction is shown in the side elevational view, in section, of FIG. 4, which also incorporates an auxiliary regenerative device integrated with the main power device and sharing certain active regions in common therewith. As will become apparent from the description that follows, the auxiliary device through which the main power switch is gated on is completely surrounded by the main power switch and an inversion layer to insure maximum sensitivity of control of the device.

An original n-type wafer 90 is diffused on both faces thereof to form active junctions in the device. Accordingly, a p-type region 92 is formed in the bottom face of the wafer to form a rectifying junction 93 therewith, and a p-type region 94 is diffused into the entire top surface of the wafer to form a rectifying junction 95 therewith. Thereafter, an n-type region 100 is diffused into region 94 over most of the top surface area to form junction 101 but leaving a small portion of region 94 exposed near the center of the wafer in addition to an annular ring of p-type region 94 exposed adjacent the edge of the wafer. The latter ring surrounds the entire region 100. Thus the junction 101 is brought to the top surface in planar fashion. A central section of p-type region 94 and n-type region 100 is isolated by etching an annular groove or moat 106 in the top surface 104 of the wafer. This moat is etched to a depth sufficient to penetrate junction 95 between p-type region 94 and the original wafer 90. Thus a separate p-type base region 96 is isolated from the p-type base region 94 and similarly, a separate n-type emitter region 98 is isolated from the n-type emitter type region 100. P-type region 96 now forms a rectifying junction 97 with the original wafer 90, which was originally a part of rectifying junction 95. Similarly, n-type emitter region 98 includes a rectifying junction 99 with the p-type region 96, wherein this junction was originally a part of the emitter junction 101.

The annular groove 106 is filled with glass 108 of the above description, so that an inversion layer 110 is formed along the surface of the groove. Actually, this inversion layer is of p-type conductivity and is formed at the surface of the groove in n-type emitter regions 100 and 98, and along the surface of the groove in n-type base region 90.

An electrode 112 is applied to the bottom surface of the wafer in contact with p-type emitter region 92, and a lead 113 is attached thereto. An annular electrode 114 is applied to the top surface of the wafer surrounding the groove 106 and shorts across emitter junction 101 by crossing this junction at the top surface 104 in contact with both the n-type emitter region 100 and p-type region 94. A lead 115 is attached to the electrode 114. Another electrode 116 is attached to the top surface of the auxiliary n-type emitter region 98, and a lead 117 connects this electrode in common with electrode 114. Another electrode 118 is attached to the portion of the auxiliary p-type base region 96 which extends to the surface, with a lead 119 being attached thereto.

The main power device of FIG. 4 has a shorted emitter base construction described to improve its higher temperature operating characteristics. This device also has the advantage of having the n-type emitter region 98 and p-type base region 96 of the auxiliary device, through which the operation of the device is controlled, essentially surrounded by inversion layers for shunting out leakage currents. A schematic representation of these inversion layers along the surface of the groove 106 is shown in FIG. 5, wherein corresponding regions of the device are designated by the same numerals employed in FIG. 4. It will be emphasized that the electrical schematic representation of FIG. 5 is not exact but is used for purposes of explanation only. The inversion layers formed at the surface of the groove in the various regions of the device, or in the adjacent surface of the glass 108, are p-type conductivity and are formed in the n-type regions 90, 98 and 100. For purposes of clarity, it can be considered that the p-type inversion layer formed in the surface of n-type emitter 100 exposed by the groove constitutes a resistive connection, designated $R_1$, between n-type emitter region 100 and p-type base region 94. Similarly, the inversion layer formed in n-type emitter 98 can be considered a resistive connection designated $R_2$, connected between n-type emitter region 98 and p-type base region 96. The p-type inversion layer formed at the surface of wide n-type base region 90 of the original wafer exposed by the groove constitutes a resistive connection, designated $R_3$, between p-type base region 96 of the auxiliary device and p-type base region 94 of the main power switch. It will be understood that the values or magnitudes of these resistors change as a function of temperature according to the *v–i* characteristics described in the graph of FIG. 2.

Should any leakage current from any source tend to flow across the auxiliary n-type emitter junction 99, the emitter junction 101 of the main power switch, or across junctions 95 or 97, these currents will be shunted out or shorted to electrode 114. More accurately, the p-type conductivity inversion layers established in the n-type regions just described shunt carriers around these junctions so that carriers are not injected across the junctions.

The device is gated on by applying a gate signal to lead 119 to cause the auxiliary device to become regenerative. Once the auxiliary device has become regenerative, the wide base region 90 is essentially flooded with current carriers in sufficient magnitude to cause the main power device to switch or become regenerative.

Figure 6:
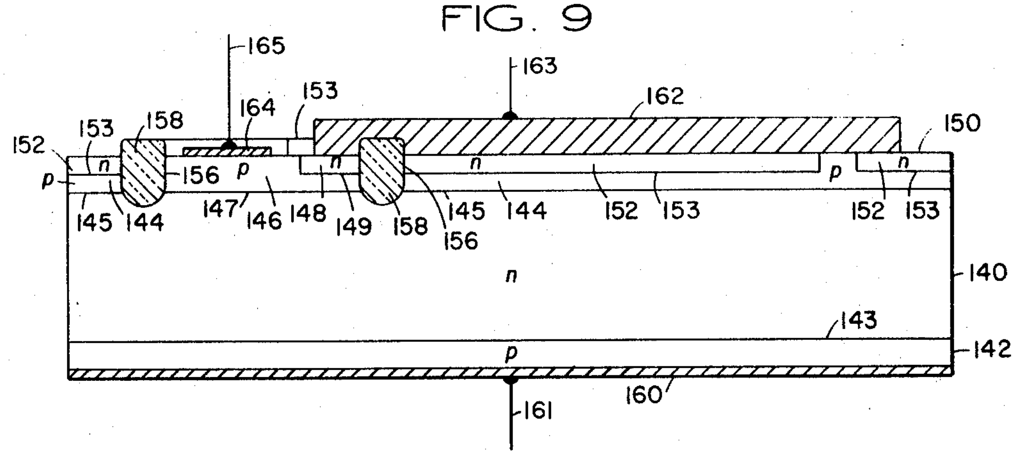

A device of substantially equivalent characteristics to that just described but having a different geometry of construction is shown in a side elevational view, in section, of FIG. 6. Reference will also be had to the plan view, partly schematic, of the device shown in FIG. 7, wherein FIG. 6 is taken diagonally in section across the device shown in FIG. 7 through section line 6—6. To help in an understanding of the device, reference will first be had to FIG. 7 so that the overall geometry of the device will be seen. This particular device also comprises an auxiliary regenerative device through which the switching of the device is controlled. In FIG. 7, essentially the entire wafer of the device constitutes the main power switching portion. Surrounded by the main switch device are regions of the auxiliary device shown as a p-type base region 146 and an n-type emitter region 148.

Referring now to FIG. 6, an n-type wafer 140 is diffused on both faces thereof to form p-type regions in these faces. P-type region 142 is diffused in the bottom surface of the wafer and forms a rectifying junction 143 therewith, and a p-type region 144 is diffused in the top surface 150 of the wafer to form rectifying junction 145 therewith. This particular p-type region is formed over the entire surface of the wafer during the diffusion thereof. Subsequently, an area corresponding to region 146 shown in FIG. 7, and another area 146' spaced diagonally from these regions, are masked, and then the entire top surface of the wafer with the exception of the two masked regions is diffused to form an n-type conductivity region 152 therein forming a junction 153. Thereafter, a moat or groove 156 is etched in the top surface of the wafer to penetrate junction 145 so that it completely surrounds p-type region 146, and isolates an n-type region 148 which was originally a part of the emitter region 152. Thus p-type region 146 forms a separate rectifying junction 147 with the original n-type wafer 140, and n-type region 148 becomes isolated from n-type region 152 and is separated from p-type region 146 by separate junction 149.

The auxiliary control device now comprises the n-type emitter region 148, the p-type base region 146, the wide n-type base region 140 and the p-type emitter region 142, the latter two of which are regions shared in common with the main power switch. The main power switch integrated in the wafer now comprises the n-type emitter region 152, the p-type base region 144, the wide n-type base region 140 and the p-type emitter region 142. The side elevational view, in section, of FIG. 6 appears to show the n-type emitter region 152 in three separate sections, although it will be understood that this region is a single contiguous region completely surrounding the emitter and base regions of the auxiliary device. As described in the fabrication of the device, a portion 146' of the p-type base region 144 is brought to the surface during the diffusion of the n-type emitter region 152 to expose a portion of the former for purposes of shorting these two regions together with an electrode.

Glass 158 of the type described above is employed to seal the moat to provide inversion layers at the surfaces of the n-type conductivity regions exposed at the surfaces of the moat. Again, this moat 156 completely surrounds regions 146 and 148 as more clearly shown in FIG. 7. Therefore, there is an inversion layer formed at the surface of the emitter region 148 that is exposed at the surface of the moat, which inversion layer extends within the moat around a greater majority of the circumference of this region, as seen in FIG. 7. A portion of junction 149 along the line of intersection between regions 148 and 146 is not adjacent the groove. Similarly, an inversion layer is formed in the surface of n-type base region 140 that is exposed in the bottom of the moat, which inversion layer completely surrounds both the p-type base region 146 and the n-type emitter region 148. Any leakage currents that tend to cross either of junctions 147 or 149 are therefore shunted out through the inversion layers.

An electrode 160 is attached to the surface of the p-type emitter region 142 and a lead 161 is attached thereto. An electrode 164 is attached to the top surface of the p-type base region 146 of the auxiliary device and a lead 165 is attached thereto. The gate signal for controlling the switching of the device is attached through lead 165. A large electrode 162 is applied to the top surface 150 of the wafer in a geometrical configuration similar to that shown in FIG. 7 and a lead 163 is attached thereto. Electrode 162 also contacts the major surface area of auxiliary n-type emitter region 148, but neither contacts the auxiliary p-type base region 146 nor shorts the exposed portion of junction 149 coming to the surface between regions 146 and 148. This electrode also makes contact to the large surface area n-type emitter region 152 and the surface exposed portion of p-type base region 144. Thus the n-type emitter region 152 and the p-type base region 144 are connected together by shorting across junction 153 exposed at the surface of the device. Moreover, all the surface of region 152 can be plated to provide direct contact between this region and electrode 162. The operation of this device is the same as described with reference to FIG. 4 and is arranged in the geometrical configurations just described so that a single electrode 162 can be employed to make contact to all of regions 148, 152 and 144.

The device described in FIG. 4 can be considered as having a mesa type construction in that the auxiliary n-type emitter region 98 and auxiliary p-type base region 96 are initially formed as a portion of the main emitter region 100 and main p-type region 94, respectively, and are then isolated by etching moat 106. A device of all planar type construction but otherwise essentially identical to the device of FIG. 4 is shown in the side elevational view, in section, of FIG. 8. Here, the original n-type wafer 170 is diffused in the bottom surface to form a p-type emitter region 172 forming a rectifying junction 173 therewith. Simultaneously, suitable masking techniques are employed on the top surface 184 of the wafer to diffuse an annular p-type base region 174 for the main switch device and an auxiliary p-type base region 176 located centrally of the wafer surface and surrounded by but spaced from the main p-type base region 174. This is accomplished in planar fashion by bringing the junctions of these particular p-type base regions to the surface of the device. The main p-type base region forms a rectifying junction 175 with the original wafer 170, and the auxiliary p-type base region 176 forms a rectifying junction 177 with the main wafer 170. Thereafter, the top surface of the wafer is again suitably masked and emitter regions are diffused into the p-type base regions. In this case, an annular main n-type region 178 is diffused into the p-type base region 174, with a rectifying junction 179 formed therewith being brought to the surface of the device. Similarly, an auxiliary n-type emitter 180 is diffused into p-type base region 176 and forms a rectifying junction 181 therewith that is also brought to the surface.

An electrode 186 is attached to the surface of emitter region 172 on the bottom of the wafer, and a lead 187 is attached thereto. An annular electrode 188 is attached to the top surface of the wafer, which shorts together p-type base region 174 and n-type emitter region 178 by crossing junction 179. A lead 189 is attached thereto. Another electrode 190 is attached to the surface of n-type emitter region 180, and a lead 191 is attached thereto and connected to lead 189 to establish both n-type emitter regions 178 and 180 at the same potential when a voltage is applied between leads 187 and 189. Finally, an electrode 192 is attached to the top surface of the auxiliary p-type base region 176 and a lead 193 is attached thereto, whereby the control signal is applied to lead 193.

Glass 196 as previously described is applied to the top surface of the wafer between the electrodes to cover the remaining surface of the wafer, whereby this glass, when applied, forms inversion layers at the surfaces of the n-type conductivity regions that it touches or contacts. Thus a p-type conductivity inversion layer is formed in the surface of the main n-type base region 170 to provide a shunting path between the auxiliary p-type base region 176 and the main p-type base region 174. Moreover, the glass crosses junction 181 of the auxiliary emitter to provide an inversion layer along the surface of the exposed portion of the auxiliary n-type emitter region. This prevents leakage current from crossing junction 181 that would cause the auxiliary device to tend to become regenerative at uncontrolled times, and shunts these carriers around this junction into the p-type base region 176. The operation of this device is the same as that described with reference to FIG. 4.

Figure 9:
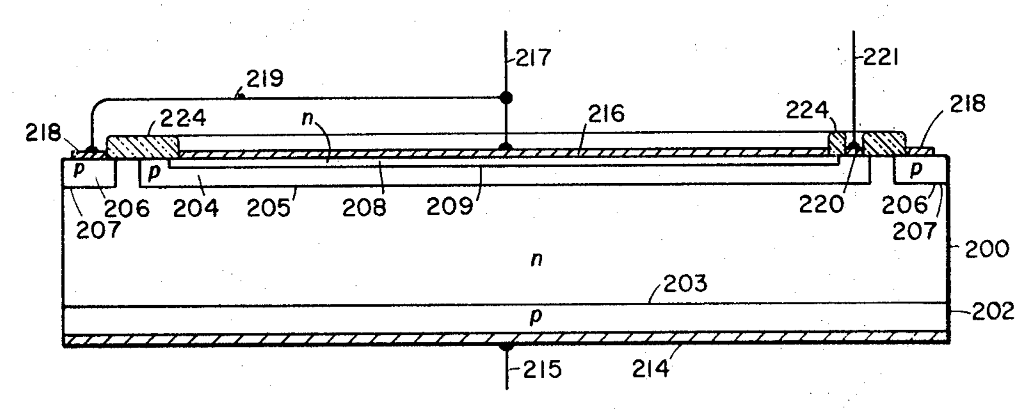

The device previously described in FIG. 3 employs an auxiliary p-type base region 66 into which leakage current is shunted and conducted to conduction electrode 75. This particular region 66 does not necessarily surround the p-type base region 64 nor the n-type emitter region 70. Thus this particular device employs inversion layers for shunting across only portions of junction 71 and 65. To provide more shunting, the p-type region 66 can be extended to completely encircle the n-type emitter and p-type base regions. Referring to the side elevational view, in section, of FIG. 9, an original n-type wafer 200 is diffused in the bottom surface to form a p-type emitter region 202 forming a rectifying junction 203 therewith. Thereafter, suitable masking is employed to form, simultaneously, a p-type base region 204 disposed centrally in the wafer and covering most of the surface area thereof, forming rectifying junction 205 with the original wafer. At the same time, an annular p-type region 206 is formed adjacent the periphery of the wafer that completely encircles p-type base region 204 and is spaced therefrom, and forms rectifying junction 207 with the original wafer. Thereafter, an n-type emitter region 208 is diffused in the top surface of region 204 and forms a rectifying junction 209 therewith.

An electrode 214 is attached to the bottom surface of the wafer to contact the p-type emitter region 202, and a lead 215 is attached thereto. Another electrode 216 is attached to the n-type emitter region 208 and a lead 217 is attached thereto. Another electrode 218 is attached to the p-type region 206 and a lead 219 is attached thereto and connected to the conduction lead 217. Another electrode 220 is attached to a surface exposed portion of the p-type base region 204, and a lead 221 is attached thereto through which a gate signal is applied to the device. Glass 224 is now applied to the remaining exposed surface area of the wafer at the top in the form of an annular ring that crosses the surface exposed portions of the junctions 205 and 209. Inversion layers are formed in the surface exposed portions of the n-type regions adjacent the glass, and substantially all leakage current is shunted around junctions 205 and 209 through p-type regions 206, electrode 218 and to the conduction terminal 217. Thus the emitter and base regions of the power switch are completely encircled.

A symmetrical conducting device employing the concept of the invention is shown in the side elevational view, in section, of FIG. 10. Before describing this device, some remarks about bilateral or symmetrical device and means for gating these devices will prove helpful. Because these devices have little sensitivity to a gating signal, especially the shorted emitter-base constructions, a gate pulse of relatively high energy is used to switch the device. This pulse is normally derived from the charge stored on a capacitor as it is discharged into the device control region, whereby the capacitor is charged through a resistor and discharged through a suitable trigger device, such as an n-p-n trigger diode. The pulse provided usually generates a relatively high gate current over a relatively short period of time. However, this type of pulse generating circuit results in a hysteresis effect to cause the device to fire at a different time during the next half cycle of AC voltage, or at different times in the next few succeeding half cycles. This effect is caused by discharging into the device some of the charge on the capacitor, since the voltage across the trigger diode through which the capacitor is discharged drops when it breaks down.

The device of FIG. 10 to be described below does not require a gate pulse as such but is switched on with a very low current signal. This results from its highly sensitive turn-on characteristics. Since this is the case, it is not necessary to discharge a capacitor to produce the pulse, and thus hysteresis effects are eliminated. An R-C network is again employed to charge a capacitor to a predetermined voltage before switching the device, the time during each half cycle for switching depending upon the setting of the variable resistance value that determines the time at which the capacitor becomes charged. Charging a capacitor is necessary only to be able to regulate time for controlling the switching of the device during the entire half cycle. A voltage blocking device is employed, such as a Zener diode, connected between the capacitor and gate control terminal to block any gate signal applied to the device until the capacitor charges to the breakover voltage of the Zener diode. Once the capacitor attains this voltage, the current through the Zener increases to hold the voltage constant thereacross, but the Zener does not have a voltage drop back after breaking down. Thus the capacitor attains the Zener voltage and remains there without discharging, and the current conducted by the Zener once this voltage is attained causes the device to switch. Since the capacitor does not discharge at this time, hysteresis effects are eliminated.

A side elevational view, in section, of a symmetrical or bilateral conducting device according to the invention is shown in FIG. 10, which device also includes a Zener diode in the gate electrode circuit for the purpose described above. A wafter 230 of semiconductor material is diffused in both faces thereof to form a p-type region 232 in the bottom face that forms a rectifying junction 233 therewith, and a p-type region 234 in the top face that forms a rectifying junction 235 therewith. By using suitable masking and photographic techniques, n-type impurities are diffused into the opposite faces of the wafer to form an n-type region 236 forming a rectifying junction 237 with p-type region 232, and a first n-type region 238 in the top surface of the wafer forming a rectifying junction 239 with p-type region 234 and a second n-type region 240 spaced from region 238 and forming a rectifying junction 241 with the p-type region. After these diffusions, an annular moat or groove 252 is cut in the top surface of the wafer to a depth sufficient to penetrate junction 235 so as to isolate another n-type region 246, while at the same time isolating a p-type region 244, originally a part of p-type region 234, that forms a rectifying junction 245 with the original wafer. Thus n-type region 246 forms a separate rectifying junction 247 with newly formed region 244 and a mesa type structure is formed in the center 250 of the wafer.

Similarly, another moat or groove 270 is etched in the bottom surface of the wafer centrally disposed to a depth sufficient to penetrate junction 233. This groove is also annular and is essentially concentric with annular groove 252 but of smaller radius. In so doing, a separate n-type region 264 is isolated that forms a rectifying junction 265 with the contiguous p-type region and a separate p-type region 266 is isolated and forms a rectifying junction 267 with the original wafer.

After the grooves are etched, groove 252 is filled with glass 254 of the type described above, and similarly, groove 270 is filled with the glass 272, all to form inversion layers at the surface exposed portions of the various n-type regions exposed by the moat, so as to provide a shunting path around surface exposed junctions.

An electrode 280 is bonded to the bottom surface of the wafer over the entire surface area thereof to short all of regions 232, 236 and 264. A lead 281 is attached to the electrode. Another annular electrode 282 is bonded to the top surface of the wafer outside the moat 252 so as to contact both of regions 238 and 234, shorting these regions together. It will be understood that p-type region 234 is annular and extends around the entire slice, whereas region 238 is essentially semi-annular. A lead 283 is attached to electrode 282. Another electrode 284 is attached or bonded to n-type region 246 and a lead 285 is connected thereto and to lead 283. Still another electrode 286 is bonded to the surface of n-type region 240 and a lead 287 is attached thereto.

The device whose construction has just been described comprises essentially two main power switching systems for two opposite polarities respectively. Thus, when a negative voltage is applied to conduction electrode 283 with respect to conduction electrode 281, the device will switch to a low impedance state between these conduction electrodes, upon being gated with a proper signal, through regions 238, 234, 230 and 232. When the voltage applied to conduction electrode 283 is positive with respect to that applied to conduction electrode 281, the conducting device comprises regions 234, 230, 232 and 236.

The operation of the device is as follows: When the voltage applied to conduction terminal 283 is negative with respect to the voltage applied to conduction terminal 281, the device can be caused to switch by applying a positive gate signal to control terminal 287 in the sense that the voltage applied to terminal 287 is positive with respect to the voltage applied to electrode 284 of the auxiliary emitter 246. However, junction 241 is reverse-biased in this case and current will not flow into the auxiliary p-type base region 244 until the Zener voltage of junction 241 is attained. Thus it will be seen that for the polarities specified, the Zener diode effect is integrated within the device itself. Once the Zener voltage is attained upon the charging of the externally connected capacitor (not shown), emitter 246 will inject current carriers into the wide base region 230, causing an auxiliary device comprising auxiliary emitter 246, auxiliary base 244, wide base region 230 and main p-emitter 232 to become regenerative. When this happens, the wide base region 230 is flooded with carriers, causing the main power device to switch.

When the voltage applied to conduction terminal 283 is positive with respect to the voltage applied to conduction terminal 281, the device may be caused to switch by applying a negative gate signal to control terminal 287 in the sense that the voltage applied to terminal 287 is negative with respect to the voltage applied to terminal 285. In this case, junction 241 is forward biased, as is junction 265 of the lower auxiliary n-type emitter 264. However, junction 247 of the auxiliary n-type emitter 246 is reverse-biased and current will not flow through control terminal 287 until the Zener voltage of junction 247 is attained. Once this occurs, either one or both of n-emitters 240 and 246 will emit carriers that enter the auxiliary p-base region 244. Many of these carriers are collected at junction 245 and flow into the wide base region 230. However, because of the polarity of the electric field, these carriers do not cross the wide base region 230 but flow back to junction 245 and are collected thereby. Upon this process the junction of p-type base region 244 injects holes that do cross the wide base region to initiate regeneration. In so doing, regeneration is effective with auxiliary n-type emitter 264, auxiliary p-base 266, wide base region 230 and main p-emitter 234. Other combinations of regions that may undergo regeneration are possible. In any event, the wide base region 230 is flooded with carriers, causing the main power device to switch.

It will be seen that the lower auxiliary n-type emitter region 264 and auxiliary p-type base region 266 are effective for initiating regeneration once the Zener voltage is attained during the polarities just described. Therefore, it is important that the auxiliary p-type base region 266 is isolated from the main p-type emitter 232 so that it is not shorted with the main n-type emitter 236. This provides, in this particular quadrant for switching, the sensitivity required. In so doing, however, it is important that the surface exposed junctions include the inversion layers provided by the glass to shunt the leakage currents around these junctions to maintain the sensitivity.

It will now be apparent that the conducting device of FIG. 10 has integrated therewith the necessary Zener effect for proper control along with the high degree sensitivity provided by the construction according to the invention. Moreover, this symmetrical device includes shorted emitter-base constructions for the main device which give the device the improved high temperature operating characteristics and low sensitivity to *dv/dt* effects that may occur in the line voltage.

A few other observations about the devices of the invention will additionally serve in an understanding thereof. It will be seen from the graphical representation of the *v–i* characteristics of the invension layer shown in FIG. 2 that there is no offset voltage required for conduction through the inversion layers. That is to say, the conduction curve or the inversion layers crosses through the 0, 0 point of the graph. Thus leakage currents will be conducted through the inversion layers at all voltages.

It has been shown that the device of FIG. 10 can be switched in two quadrants; namely, one quadrant in which the voltage applied to conduction terminal 283 is negative with respect to the voltage applied to conduction terminal 281 along with a positive voltage applied to control terminal 287 with respect to terminal 283; the other quandrant in which the voltage applied to terminal 283 is positive with respect to the voltage applied to terminal 281 and with a voltage applied to terminal 287 that is negative with respect to the voltage applied to terminal 283. It will be emphasized, however, that this device will switch in the other two quadrants, as will be recognized and understood by those skilled in the art.

It will also be understood that the several geometries of the construction of the device can be changed to achieve desired effects, and that the particular contructions shown are not to be construed as limiting. Moreover, the various electrical conductivity types of the region can be interchanged, all is as well known. Thus many modifications and substitutions can be made without departing from the true scope of the invention, which modifications and substitutions will undoubtedly become apparent to those skilled in the art. Accordingly, it is intended that the invention be limited only as defined in the appended claims.

What is claimed is:

1. A semiconductor regenerative switch device comprising a body of semiconductor material including at least four successively adjacent regions of alternate electrical conductivity types with rectifying junctions between adjacent regions, first and second of said at least four regions that are non-contiguous constituting first and second emitters having first and second electrical conductivity types, respectively, and third and fourth of said at least four regions constituting first and second bases having said second and said first electrical conductivity types and being contiguous to said first and said second emitters, respectively, first and second conduction electrodes interconnected with said first and said second emitters, respectively, and a control electrode interconnected with said first base, said device characterized by exhibiting a normally high impedance state between said first and said second conduction electrodes and caused to become regenerative to exhibit a low impedance state therebetween in the presence of the voltage applied across said first and said second conduction electrodes when a gate signal is applied to said control electrode, the improvement comprising:

(a) said first and said second bases having contiguous surface exposed portions, (b) another region contiguous to said second base having said second electrical conductivity type and being spaced from said first base by said surface exposed portion of said second base, (c) means electronically connecting said another region to said first conduction electrode, and (d) an inversion layer at said surface exposed portion of said second base connecting said first base to said another region.

2. A semiconductor regenerative switch device as set forth in claim 1 including a third emitter having an electrical conductivity of said first type contiguous to said another region, and said means electrically connecting said another region to said first conduction electrode comprises an electrode that is connected to said third emitter.

3. A semiconductor regenerative switch device as set forth in claim 2 wherein the area of the junction between said third emitter and said another region is greater than the area of the junction between said first emitter and said first base.

4. A semiconductor regenerative switch device as set forth in claim 1 wherein said first emitter has a surface exposed portion, including resistance means at the surface exposed portion thereof that extends from the junction between said first emitter and said first base to said first conduction electrode for shunting leakage current around the junction therebetween.

5. A semiconductor regenerative switch device as set forth in claim 4 wherein said inversion layer is coextensive with the circumference of the junction between said first base and said second base, and said resistance means is coextensive with a major portion of the circumference of the junction between said first emitter and said first base.

6. A semiconductor regenerative switch device as set forth in claim 4 wherein said inversion layer and said resistance means are comprised of the combination of surface exposed portions of said device and a glass composition fused thereto, said glass composition having impurities causing said inversion layer and said resistance means to form when fused to said surface exposed portions.

7. A semiconductor regenerative switch device as set forth in claim 6 wherein said impurities comprise boron atoms.

8. A semiconductor regenerative switch device as set forth in claim 1 wherein said inversion layer is coextensive with the circumference of the junction between said first base and said second base.

9. A semiconductor regenerative switch device as set forth in claim 1 wherein said another region laterally surrounds said first base, and said inversion layer is coextensive with the circumference of the junction between said first base and said second base.

10. A semiconductor regenerative switch device as set forth in claim 9 wherein said another region is spaced from said first base by a continuous groove in the surface of said device that extends through the junction between said second base and said another region.

11. A semiconductor regenerative switch device as set forth in claim 1 including a third emitter of said first electrical conductivity type contiguous to said another region, said means electrically connecting said another region to said first conduction electrode comprises a third conduction electrode connected to both of said another region and said third emitter, a fourth emitter of said first electrical conductivity type contiguous to said first base and spaced from said first emitter to which said control electrode is interconnected to said first base, a first continuous groove completely encircling all of said first base, said first emitter and said fourth emitter and which extends through the junction between said first base and said second base with all of the junctions between said another region and said third emitter, said first emitter and said first base, and said fourth emitter and said first base, extending to the surface of said first groove, said inversion layer at said surface exposed portion of said second base being coextensive with the bottom of said first groove and extending from the junction between said another region and said second base to the junction between said first base and said second base, a fifth emitter of said first electrical conductivity type contiguous to said second emitter, said second conduction electrode is connected to both said second and said fifth emitters, a third base of said second electrical conductivity type contiguous to said second base and spaced from said first base by the width of said second base, a sixth emitter of said first electrical conductivity type contiguous to said third base and to which said second conduction electrode is also connected, a second groove completely encircling said third base and said sixth emitter extending through the junction between said second base and said second emitter with the junction between said second emitter and said fifth emitter and the junction between said third base and said sixth emitter extending to the surface of said second groove, and another inversion layer coextensive with the bottom of said second groove that extends from the junction between said second base and said second emitter to the junction between said second base and said third base.

12. A semiconductor regenerative switch device as set forth in claim 1 wherein said inversion layer is comprised of the combination of said surface exposed portion of said second base and a glass composition fused thereto, said glass composition having impurities causing said inversion layer to form when fused to said surface exposed portion.

13. A semiconductor regenerative switch device as set forth in claim 12 wherein said impurities comprise boron atoms.

References Cited

UNITED STATES PATENTS 3,271,640 9/1966 Moore ------------- 317—235

JERRY D. CRAIG, Primary Examiner

UNITED STATES PATENT OFFICE

CERTIFICATE OF CORRECTION

Patent No. 3,524,114 Dated August 11, 1970

Inventor(s) Jearld L. Hutson

It is certified that error appears in the above-identified patent and that said Letters Patent are hereby corrected as shown below:

Column 1, line 37, after "itself" insert -- to --. Column 6, line 12, "les" should read -- less --. Column 8, line 6, cancel "described". Column 9, line 58, "attached" should read -- applied --; line 59, "applied" should read -- attached --; line 68, after "portion" insert -- 146' --. Column 12, line 14, "wafter" should read -- wafer --. Column 14, line 1, "invension" should read -- invention --; line 62, "electronically" should read -- electrically --.

Signed and sealed this 15th day of June 1971.

(SEAL)
Attest:

EDWARD M.FLETCHER,JR.
Attesting Officer

WILLIAM E. SCHUYLER, JR.
Commissioner of Patents